(12) United States Patent
Tunks et al.

(10) Patent No.: US 12,317,446 B2
(45) Date of Patent: May 27, 2025

(54) SYSTEM AND METHOD FOR IMPROVING RATE OF AIR FLOW THROUGH DATA PROCESSING SYSTEMS

(71) Applicant: Dell Products L.P., Round Rock, TX (US)

(72) Inventors: Eric Michael Tunks, Austin, TX (US); Julian Yu-Hao Chen, Austin, TX (US); Shun-Cheng Hsu, Zhubei (TW); Austin Michael Shelnutt, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 292 days.

(21) Appl. No.: 18/048,144

(22) Filed: Oct. 20, 2022

(65) Prior Publication Data

US 2024/0138097 A1   Apr. 25, 2024
US 2024/0237267 A9   Jul. 11, 2024

(51) Int. Cl.
*H05K 7/20* (2006.01)
*G06F 1/20* (2006.01)
*H05K 9/00* (2006.01)

(52) U.S. Cl.
CPC ......... *H05K 7/20136* (2013.01); *G06F 1/20* (2013.01); *H05K 9/0015* (2013.01)

(58) Field of Classification Search
CPC ..... H05K 7/20136; H05K 9/0015; G06F 1/20
USPC .................................................. 361/679.48
See application file for complete search history.

(56) References Cited

U.S. PATENT DOCUMENTS

| | | | | |
|---|---|---|---|---|
| 3,204,391 A | * | 9/1965 | Schwab | F24F 8/108 55/374 |
| 3,204,392 A | * | 9/1965 | Schwab | B01D 46/02 55/374 |
| 3,396,517 A | * | 8/1968 | Schwab | B01D 46/0043 55/380 |
| 3,538,686 A | * | 11/1970 | Schwab | B01D 46/02 55/377 |
| 5,171,183 A | * | 12/1992 | Pollard | G11B 33/142 |
| 5,602,721 A | | 2/1997 | Slade et al. | |
| 5,761,033 A | | 6/1998 | Wilhelm | |
| 5,888,260 A | * | 3/1999 | Sica | B01D 46/0012 55/331 |
| 5,900,595 A | * | 5/1999 | Akima | F02M 35/02483 181/272 |

(Continued)

*Primary Examiner* — Anatoly Vortman
(74) *Attorney, Agent, or Firm* — WOMBLE BOND DICKINSON (US) LLP (57) ABSTRACT

Methods, systems, and devices for managing the operation of data processing systems are disclosed. A data processing system may include a computing device that may provide computer-implemented services. To provide the computer-implemented services, hardware components of the data processing system may need to operate within certain thermal dissipation requirements. To regulate the temperature of the hardware components, a fan may circulate air through the data processing system when the temperatures fall outside the thermal dissipation requirements. To regulate the temperature of the hardware components more efficiently, higher air flow rates may be desired. To increase air flow rates, a three-dimensional ventilation port may be implemented to de-constrict air flow when air enters or exits the data processing system.

20 Claims, 9 Drawing Sheets

(56) References Cited

U.S. PATENT DOCUMENTS

| | | | |
|---|---|---|---|
| 5,955,955 A * | 9/1999 | Corcoran, Jr. | G06F 1/20 361/679.48 |
| 6,362,958 B1 * | 3/2002 | Yu | G06F 1/20 165/104.34 |
| 6,589,308 B1 * | 7/2003 | Gianelo | G06F 1/182 361/679.48 |
| 6,626,754 B2 | 9/2003 | Gebke | F24F 13/0218 454/903 |
| 6,639,794 B2 * | 10/2003 | Olarig | H05K 7/20581 361/679.48 |
| 6,747,870 B2 * | 6/2004 | Toh | H01L 23/467 257/E23.114 |
| 6,899,615 B2 * | 5/2005 | Gebke | F24F 13/068 454/903 |
| 7,068,506 B2 * | 6/2006 | Behl | G11B 33/124 |
| 7,436,665 B2 * | 10/2008 | Chen | G06F 1/20 361/679.48 |
| 7,485,168 B2 * | 2/2009 | Goupil, Jr. | B60H 1/00685 55/420 |
| 7,698,095 B2 | 4/2010 | Chung et al. | |
| 7,701,713 B2 | 4/2010 | Li | |
| 8,014,153 B2 * | 9/2011 | Ice | G02B 6/4201 361/741 |
| 8,182,319 B2 | 5/2012 | Ong et al. | |
| 8,542,484 B2 * | 9/2013 | Tanaka | G06F 1/187 361/679.55 |
| 8,550,702 B2 | 10/2013 | Campbell et al. | |
| 8,974,585 B2 * | 3/2015 | Hartmann | B01D 46/4254 96/417 |
| 9,129,958 B2 | 9/2015 | Mallik et al. | |
| 9,237,671 B2 | 1/2016 | Chen et al. | |
| 9,820,411 B2 | 11/2017 | Alshinnawi et al. | |
| 10,123,452 B2 | 11/2018 | Chen et al. | |
| 10,177,107 B2 | 1/2019 | Camarota | |
| 10,274,945 B2 | 4/2019 | Arensmeier et al. | |
| 10,709,032 B1 | 7/2020 | Holyoake et al. | |
| 10,917,996 B1 * | 2/2021 | Embleton | H05K 9/0062 |
| 10,980,159 B2 * | 4/2021 | Embleton | H04B 15/00 |
| 11,019,748 B2 | 5/2021 | Avvaru et al. | |
| 11,064,808 B2 | 7/2021 | Chen et al. | |
| 11,129,293 B2 | 9/2021 | Wurmfeld | |
| 11,129,307 B2 * | 9/2021 | Embleton | H05K 7/20727 |
| 11,135,538 B2 * | 10/2021 | Niakan | B01D 46/2411 |
| 11,262,809 B2 | 3/2022 | Pham et al. | |
| 11,293,659 B2 | 4/2022 | Brahme et al. | |
| 11,320,164 B2 | 5/2022 | Roth | |
| 11,399,450 B2 * | 7/2022 | Embleton | H05K 9/0041 |
| 11,525,590 B2 * | 12/2022 | Chen | H05K 7/20145 |
| 2001/0040203 A1 | 11/2001 | Brock et al. | |
| 2003/0202326 A1 * | 10/2003 | Toh | H01L 23/552 257/E23.114 |
| 2007/0097634 A1 * | 5/2007 | Chang | H05K 7/20727 361/695 |
| 2011/0100668 A1 | 5/2011 | Syed | |
| 2011/0228473 A1 | 9/2011 | Anderson et al. | |
| 2012/0229971 A1 | 9/2012 | Mills et al. | |
| 2014/0334084 A1 | 11/2014 | Fricker | |
| 2015/0177750 A1 | 6/2015 | Bailey et al. | |
| 2015/0180234 A1 | 6/2015 | Bailey et al. | |
| 2015/0289405 A1 | 10/2015 | Stewart et al. | |
| 2015/0359146 A1 | 12/2015 | Bailey et al. | |
| 2016/0044819 A1 | 2/2016 | Bailey et al. | |
| 2017/0177007 A1 | 6/2017 | Shelnutt et al. | |
| 2017/0181329 A1 | 6/2017 | Shelnutt et al. | |
| 2018/0011522 A1 | 1/2018 | Shirakami et al. | |
| 2022/0104380 A1 | 3/2022 | Hattangadi et al. | |
| 2022/0200250 A1 | 6/2022 | Brooks et al. | |
| 2024/0019916 A1 * | 1/2024 | Tunks | H05K 7/20209 |
| 2024/0023273 A1 * | 1/2024 | Tunks | H05K 7/20836 |

* cited by examiner

SYSTEM AND METHOD FOR IMPROVING RATE OF AIR FLOW THROUGH DATA PROCESSING SYSTEMS

FIELD DISCLOSED HEREIN

Embodiments disclosed herein relate generally to data processing system management. More particularly, embodiments disclosed herein relate to systems and methods to manage air flow in data processing systems.

BACKGROUND

Computing devices may provide computer-implemented services. The computer-implemented services may be used by users of the computing devices and/or devices operably connected to the computing devices. The computer-implemented services may be performed with hardware components such as processors, memory modules, storage devices, and communication devices. The operation of these components may impact the performance of the computer-implemented services.

BRIEF DESCRIPTION OF THE DRAWINGS

Embodiments disclosed herein are illustrated by way of example and not limitation in the figures of the accompanying drawings in which like references indicate similar elements.

DETAILED DESCRIPTION

Various embodiments disclosed herein will be described with reference to details discussed below, and the accompanying drawings will illustrate the various embodiments. The following description and drawings are illustrative disclosed herein and are not to be construed as limiting the disclosed embodiments. Numerous specific details are described to provide a thorough understanding of various embodiments disclosed herein. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment disclosed herein. The appearances of the phrase "in one embodiment" and "an embodiment" in various places in the specification do not necessarily all refer to the same embodiment.

References in the specification to "adapted to" may, in the context of a programmable device, indicate that the programmable device has been programmed to perform the functionality described with respect to the programmable devices. In the context of a static device, "adapted to" may indicate that the device include circuitry to perform the functionality described with respect to the static devices.

In general, embodiments disclosed herein relate to methods and systems for managing the operation of a data processing system. The data processing system may provide computer-implemented services.

To provide the computer-implemented services, the data processing system may include hardware components. The hardware components may have thermal dissipation requirements that must be met for the hardware components to operate nominally (e.g., with low probability of error, low chance of damage/failure, etc.). The thermal dissipation requirements may include, for example, an optimal temperature range, a threshold for a rate of air flow through the data processing system to maintain the temperature range, and/or other requirements.

To meet the thermal dissipation requirements of the hardware components, the data processing system may include a fan (and/or another system to circulate air through the data processing system). The fan may generate air flow to cool the hardware components at prescribed rates and maintain the temperature of the hardware components within their thermal dissipation requirements. The air flow may be directed along an air flow path, the air flow path beginning at a first side of the data processing system and ending at a second side of the data processing system. However, air flow rates within the data processing system may be limited by the power of the fan and by the size of the openings in the first side and second side of the data processing system.

Increasing the power of the fan to increase the rate of air flow throughout the data processing system may be impractical, as larger fans may take up an undesirable amount of space in the data processing system and/or may generate an undesirable amount of static discharge within the data processing system during operation. In addition, increasing the size of the openings in one or more sides of the data processing system to de-constrict air flow may be impossible, as other components take up space on the sides of the data processing system (e.g., ports, power buttons, antenna connections, light-emitting diodes (LEDs), add-in cards, etc.). Increasing the size of an opening in one or more sides of the data processing system may also allow undesired access to the internal components of the data processing system. This undesired access may lead to damage and/or otherwise manipulation of the operation of the data processing system.

To address the limitations on air flow rates mentioned above, the data processing system may include a three-dimensional ventilation port. The three-dimensional ventilation port may alleviate constriction of air flow (when air enters or exits the data processing system, depending on the direction of air flow). Therefore, the rate of air flow throughout the data processing system may be higher when compared to a data processing system in which the rate of air flow is constricted by an opening in one side of the data processing system. To do so, the three-dimensional ventilation port may include a base and walls that define a three-dimensional space. The base and the walls may be made of a perforated screen material that allows air to flow through the base and the walls of the three-dimensional ventilation port. The three-dimensional ventilation port may be positioned proximate to an opening in one side of the data processing system. Therefore, the surface area through which air may flow may be equal to the surface area of the base and the walls of the three-dimensional ventilation port, the surface area of the base and the walls being larger than the surface area of the open area in the front of the data processing system.

Thus, embodiments disclosed herein may provide an improved data processing system that may meet thermal dissipation requirements of hardware components by increasing air flow rates throughout the data processing system. Consequently, embodiments disclosed herein may address the technical problem of thermal operating condition limitations of data processing systems. The disclosed embodiments may address this problem by providing a data processing system with increased air flow rate capabilities by de-constricting air flow entering and/or exiting the data processing system.

In an embodiment, a data processing system that provides computer-implemented services is provided. The data processing system may include an enclosure having a front and a rear that define an air flow path, the front comprising: a first area that is open, unscreened, and usable for ventilation, and a second area not usable for ventilation; a hardware component positioned along the air flow path, the hardware component having a thermal dissipation requirement that is met when a rate of an air flow along the air flow path is above a threshold; a fan positioned in an interior of the enclosure, the fan being adapted to generate the air flow along the air flow path, and the fan having an air flow generation capacity that is: sufficient to establish the rate of the air flow while the first area is open and unscreened, and insufficient to establish the rate of the air flow while the first area is not open or screened; and a three-dimensional ventilation port positioned proximate to the first area, the three-dimensional ventilation port comprising a screen that extends from edges of the first area into an interior of the enclosure, and the screen comprising an open area that that is larger than the first area.

The three-dimensional ventilation port may include a base and walls that define a three-dimensional space, the base and the walls being made of a perforated screen material.

The perforated screen material may allow the air flow to enter the three-dimensional ventilation port through the walls and the base.

The three-dimensional ventilation port may include a mechanism positioned to attach the three-dimensional ventilation port to the enclosure.

The three-dimensional ventilation port may include an electromagnetic interference gasket, the electromagnetic interference gasket being positioned to seal the three-dimensional ventilation port to at least a portion of the edges of the first area.

The data processing system may also include a lid adapted to reversibly close a top of the enclosure, wherein the three-dimensional ventilation port is attached to the lid, and removing the lid detaches the three-dimensional ventilation port from the enclosure.

The three-dimensional ventilation port may not protrude from the front and away from the enclosure.

The base and the walls may be arranged to enclose a rectangular volume, the rectangular volume positioned proximate to the first area and within the enclosure.

The hardware component may be positioned proximate to the first area, the walls and base being arranged to enclose a volume that: extends from the first area into the enclosure, and comprises: a first portion that extends a first distance from the first area, and a second portion that extends a second distance from the first area, the first distance being larger than the second distance.

One of the walls that is on an opposite side of the volume from the first area may be positioned in a first plane, the first area being in a second plane, and the first plane and the second plane not being parallel to each other.

Figure 1:
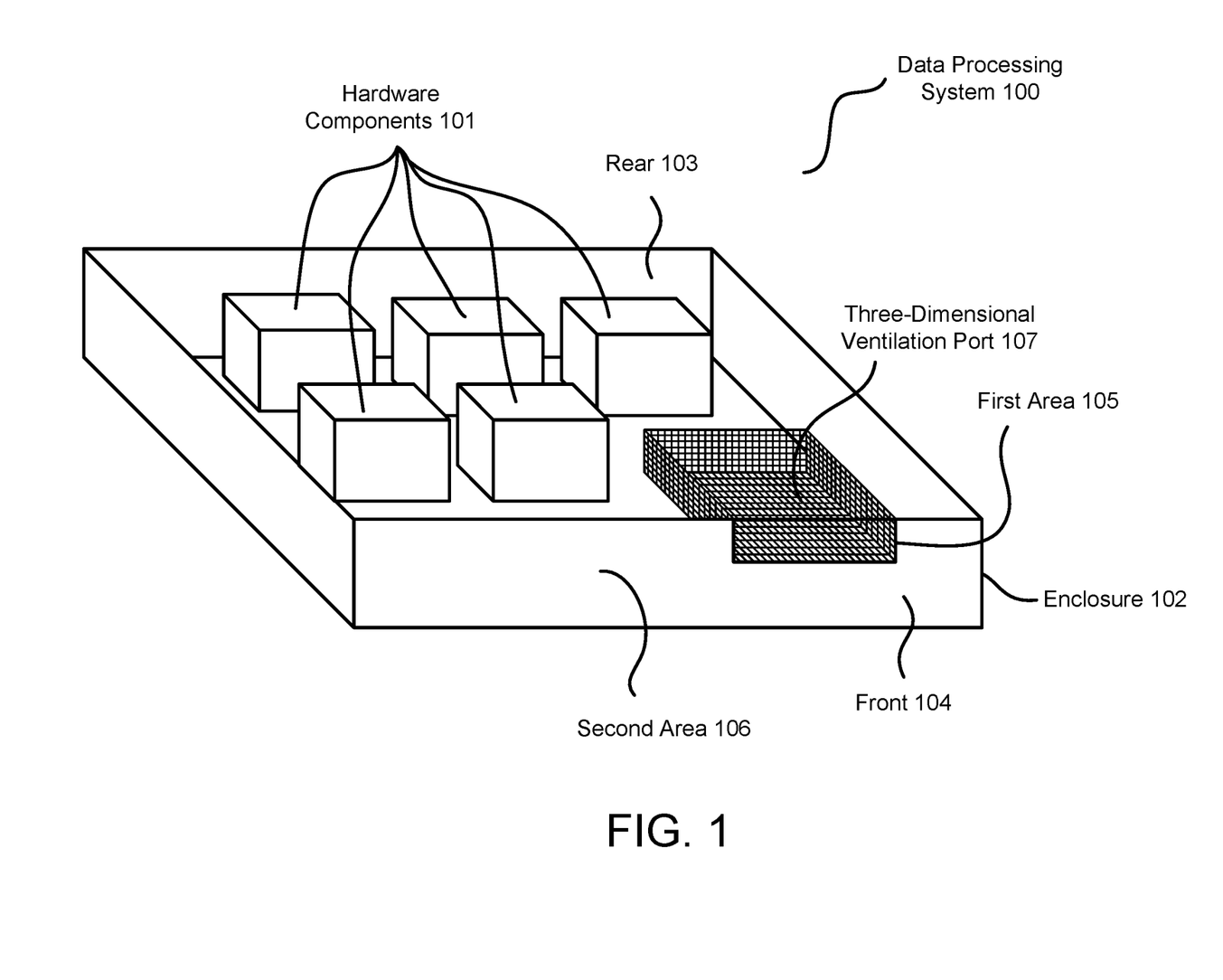
FIG. 1 shows a diagram illustrating a system in accordance with an embodiment.

Turning to FIG. 1, a block diagram illustrating a system in accordance with an embodiment is shown. The system shown in FIG. 1 may provide any quantity and type of computer-implemented services. To provide the computer-implemented services, the system of FIG. 1 may include data processing system 100.

Data processing system 100 may include functionality to provide various types of computer-implemented services. The computer-implemented services may include any number and type of computer-implemented services. The computer-implemented services may include, for example, database services, data processing services, electronic communication services, and/or any other services that may be provided using one or more computing devices. Other types of computer-implemented services may be provided by data processing system 100 without departing from embodiments disclosed herein.

To provide the computer-implemented services, data processing system 100 may include various components such as hardware components 101 positioned inside an enclosure (e.g., enclosure 102) of data processing system 100. Hardware components 101 may include any type and quantity of hardware components such as processors, memory modules, storage devices, communications devices, and/or other types of devices. Hardware components 101 may also include power supplies, fans, and/or other types of devices usable to power and/or thermally manage the hardware components. Any of these hardware components may be operably connected to one another using circuit card traces, cabling, connectors, etc.

Hardware components 101 may generate and dissipate heat (e.g., into an air flow) during performance of the computer-implemented services. However, hardware components 101 may have thermal dissipation requirements (e.g., temperature-sensitive conditions for optimal performance of the computer-implemented services). If operated at temperatures outside of these thermal dissipation requirements, hardware components 101 may not function as desired. Therefore, the computer-implemented services may not be reliably performed when the hardware components are too warm. The thermal dissipation requirements may dictate a temperature range for operation, a threshold for a rate of air flow required to maintain the optimal temperature range, and/or other requirements.

As previously mentioned, hardware components 101 may include a fan (not shown) positioned in an interior of the enclosure 102. The fan may draw air from outside enclosure 102 (e.g., cooler air) to perform thermal exchange with hardware components 101 as they generate and dissipate heat. The fan may establish an air flow path through the enclosure 102. The air flow path may begin at a first side of enclosure 102 (e.g., front 104) and may end at a second side of enclosure 102 (e.g., rear 103). Intake air (e.g., cooler air)

may enter the enclosure 102 through front 104, may travel along the air flow path, and may cool the hardware components 101. Exhaust air (e.g., warmer air) may exit the enclosure 102 via rear 103.

However, front 104 may only allow air to enter the enclosure 102 through an open area with pre-determined dimensions (e.g., first area 105). The remainder of front 104 (e.g., second area 106) may be used to house elements such as ports, power buttons, antenna connections, LEDs, and add-in cards and, therefore, may be unavailable for additional ventilation. Constricting the intake air flow to first area 105 may limit the rate of air flow through enclosure 102 to an extent that the thermal dissipation requirements of hardware components 101 may not be met.

In general, embodiments disclosed herein relate to systems, devices, and methods for improving the likelihood that data processing system 100 is able to provide its computer-implemented services. To improve the likelihood that data processing system 100 is able to provide its computer-implemented services, data processing system 100 may include functionality to provide air flow throughout data processing system 100 at rates to meet the thermal dissipation requirements (e.g., through thermal exchange) of temperature-sensitive hardware components internal to data processing system 100 and integral to the performance of the computer-implemented services.

To increase the rate of air flow through enclosure 102, data processing system 100 may include three-dimensional ventilation port 107. Three-dimensional ventilation port 107 may include walls and a base that define a three-dimensional shape as shown in FIG. 1 and described in further detail with respect to FIG. 2. Three-dimensional ventilation port 107 may be positioned proximate to first area 105 and may include a screen that extends from edges of first area 105 inwards from front 104 into the interior of enclosure 102.

The screen may be a perforated screen material (e.g., sheet metal) that allows air to flow through the base and walls of three-dimensional ventilation port 107. Three-dimensional ventilation port 107 may be positioned in an air flow path dictated by a fan (not shown). The three-dimensional ventilation port 107 may provide a larger surface area of perforated screen material through which exhaust air may flow when compared to a data processing system in which air flow is constricted to flow through first area 105 when covered by a screen.

Figure 2:
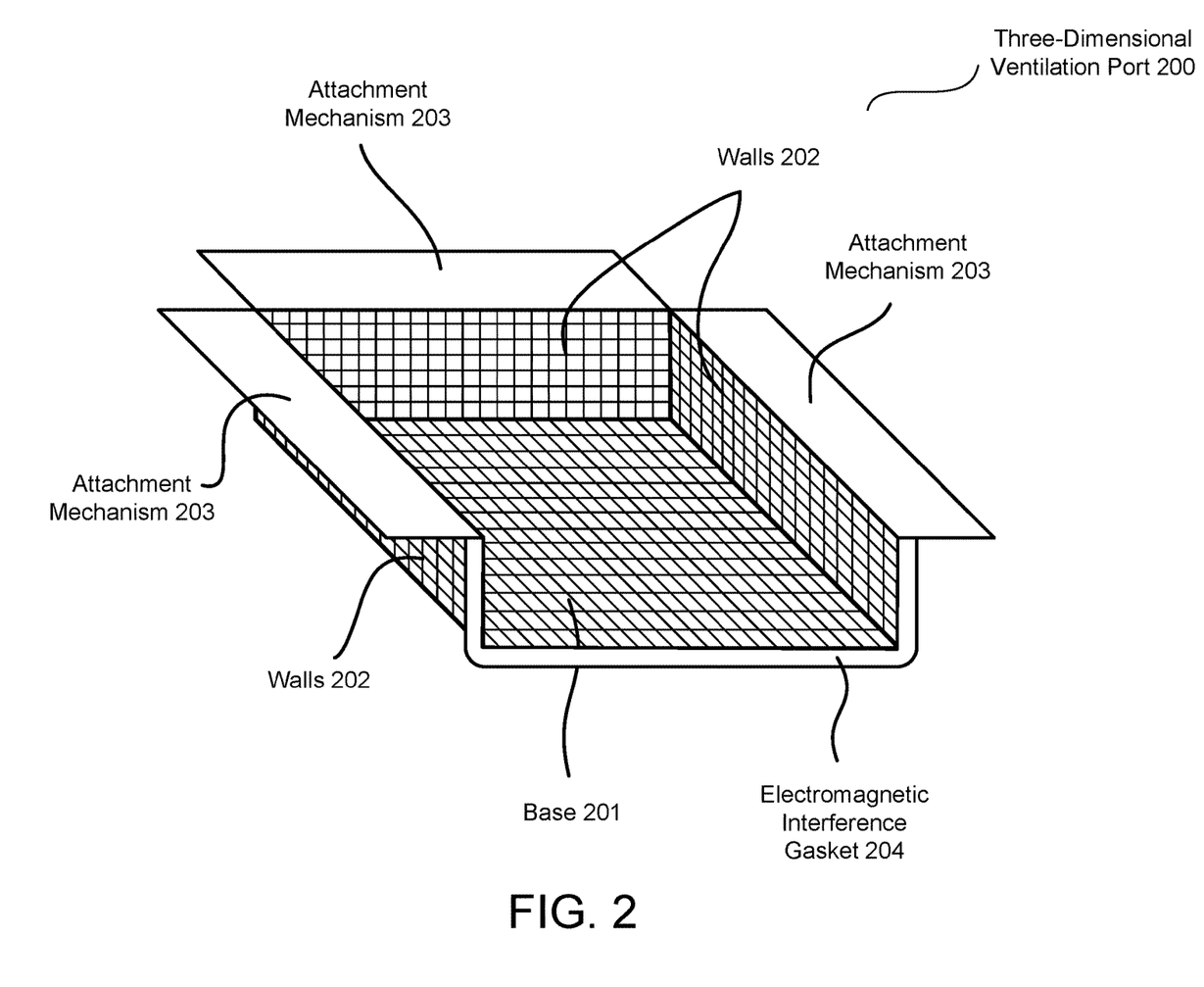
FIG. 2 shows a diagram illustrating a three-dimensional ventilation port in accordance with an embodiment.
Figure 5:
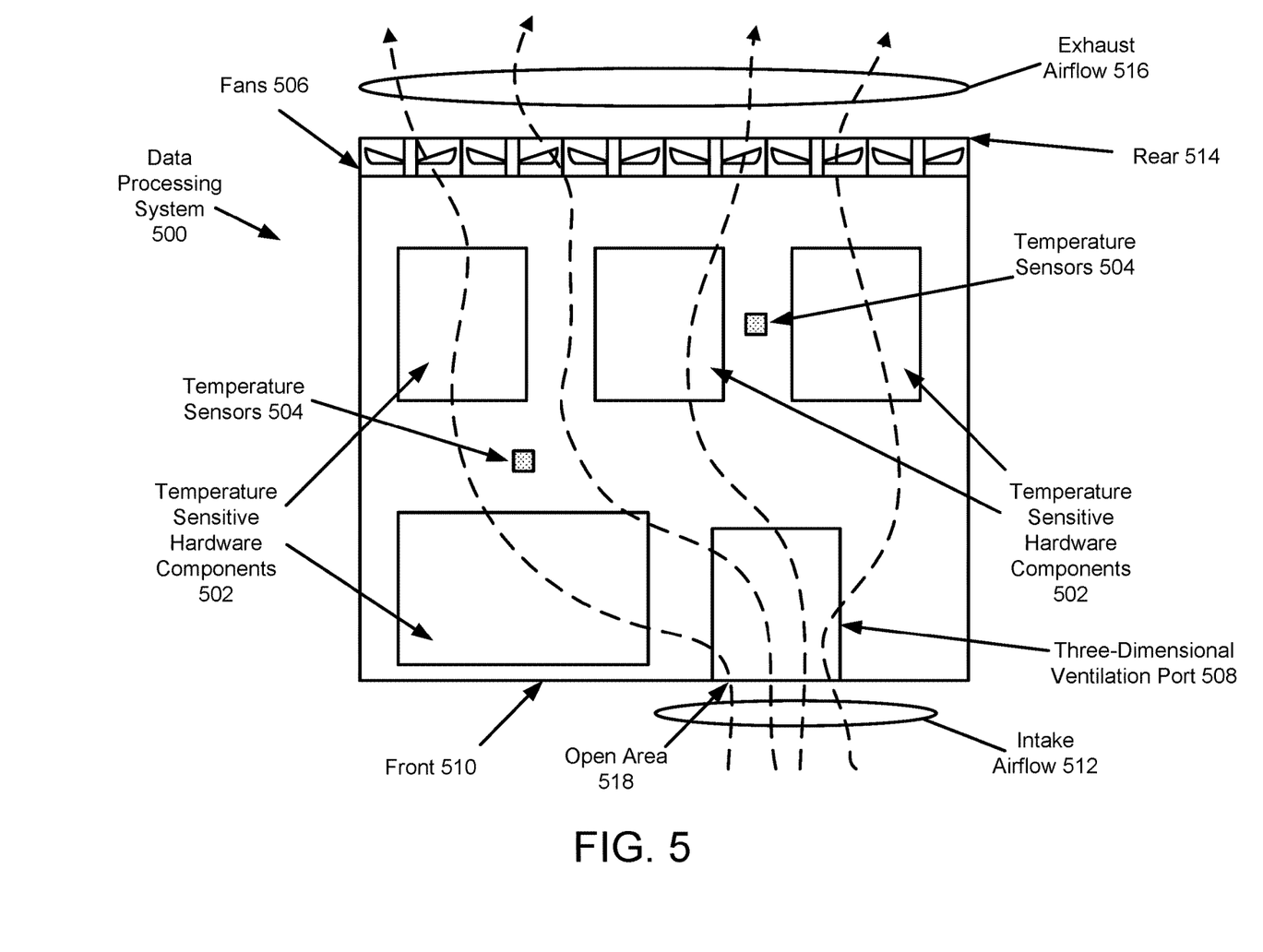
FIG. 5 shows a diagram illustrating an air flow path through an enclosure of a data processing system in accordance with an embodiment.

Therefore, three-dimensional ventilation port 107 may de-constrict air flow through first area 105. Accordingly, higher rates of air flow through enclosure 102 to cool hardware components 101 may be obtained (e.g., when compared to scenarios in which three-dimensional ventilation port 107 is not present, and a screen is placed in first area 105. Refer to FIG. 2 for additional details regarding the three-dimensional ventilation port 107. Refer to FIG. 5 for additional details regarding air flow through the enclosure 102.

While illustrated in FIG. 1 with a limited number of specific components, a system may include additional, fewer, and/or different components without departing from embodiments disclosed herein. While described above with reference to an air flow path beginning at front 104 and ending at rear 103, the air flow path may travel in the opposite direction (e.g., rear 103 to front 104) and/or via other configurations without departing from embodiments disclosed herein.

Turning to FIG. 2, a diagram illustrating a three-dimensional ventilation port in accordance with an embodiment is shown. Three-dimensional ventilation port 200 may be similar to three-dimensional ventilation port 107 discussed with respect to FIG. 1. As discussed above, the three-dimensional ventilation port 200 may de-constrict air flow through an enclosure of a data processing system by increasing the surface area through which air may enter (or exit) the enclosure. By doing so, the rate of air flow throughout the enclosure may increase and the thermal dissipation requirements of hardware components required to perform the computer-implemented services may be reliably met.

Three-dimensional ventilation port 200 may include base 201 and walls 202 that define a three-dimensional space. The base 201 may be any shape and/or dimension required to fit within unoccupied space in the enclosure (e.g., enclosure 102). In addition, walls 202 may include any number of walls required to define a three-dimensional space based on the shape and dimensions of the base 201. As shown in FIG. 2, the base 201 and walls 202 may be arranged to enclose a rectangular volume. For additional details regarding alternative configurations of the three-dimensional ventilation port, refer to FIGS. 4A-4B.

The base 201 and walls 202 may be made of a perforated screen material allowing air flow to pass through the base 201 and the walls 202. The perforated screen material may be, for example, perforated sheet metal.

Three-dimensional ventilation port 200 may include attachment mechanism 203. Attachment mechanism 203 may include any number of attachment mechanisms positioned to attach the three-dimensional ventilation port 200 to the data processing system via the enclosure, a lid of the enclosure, and/or another component of the data processing system. The attachment mechanism 203 may attach three-dimensional ventilation port 200 to the data processing system without utilizing the surfaces of the walls 202 and base 201 for attachment purposes.

Attachment mechanism 203 may include, for example, a plurality of flat pieces connected to (and perpendicular to) the edges of walls 202. The plurality of flat pieces may extend outwards from walls 202 away from the three-dimensional ventilation port 200. The flat pieces may be, for example, pieces of sheet metal shaped to fit a pre-defined area on the enclosure, lid of the enclosure, and/or other component of the data processing system. The flat pieces may include holes to accommodate screws and/or other attachment hardware adapted to attach the flat pieces parallel to the surface of attachment (e.g., a surface within the enclosure, a lid, etc.). For additional details regarding the use of an enclosure lid, refer to FIGS. 3A-3C.

Three-dimensional ventilation port 200 may include electromagnetic interference gasket 204. Electromagnetic interference gasket 204 may include any type of conductive material adapted to mitigate interference of electromagnetic radiation with the performance of the computer-implemented services. The electromagnetic interference gasket 204 may wrap around a portion of the base 201 and walls 202 where three-dimensional ventilation port 200 makes contact with the front of the enclosure 102 (e.g., front 104). By doing so, electromagnetic interference gasket 204 may suppress interference from any electromagnetic fields generated by hardware components 101 (and/or other components) within enclosure 102.

While illustrated in FIG. 2 with a limited number of specific components, a three-dimensional ventilation port may include additional, fewer, and/or different components without departing from embodiments disclosed herein.

Figure 3A:
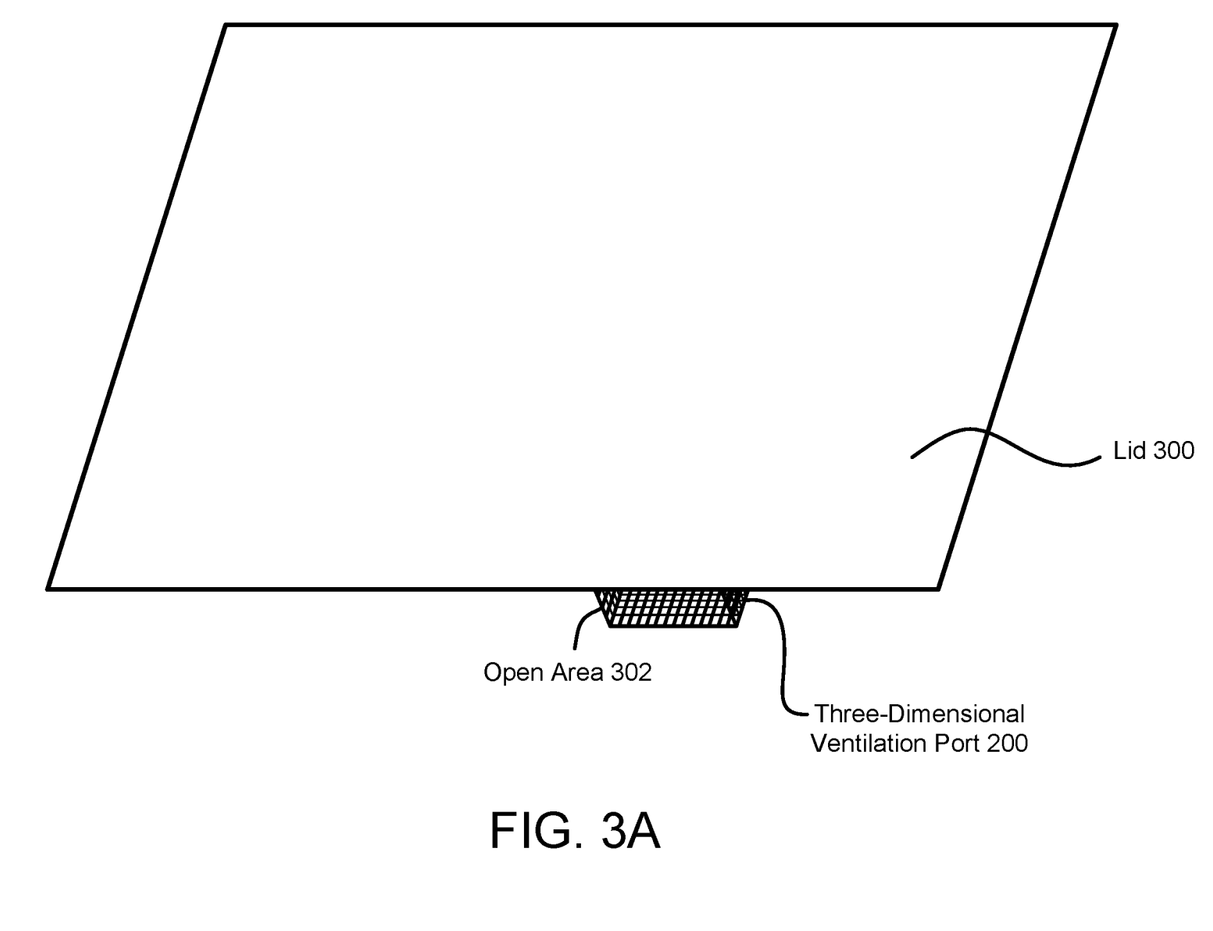
FIG. 3A shows a diagram illustrating a top view of a lid adapted to reversibly close a top of an enclosure in accordance with an embodiment.

The three-dimensional ventilation port 200 may be attached (using the attachment mechanism 203) directly to the enclosure 102. Alternatively, the three-dimensional ventilation port may be attached to a separate component (e.g., a lid of the enclosure) and may be removable from the data processing system 100. Turning to FIG. 3A, a top view of a lid adapted to reversibly close a top of an enclosure (e.g., enclosure 102) is shown. Three-dimensional ventilation port 200 may be attached to lid 300.

Three-dimensional ventilation port 200 may be attached to lid 300 using an attachment mechanism similar to attachment mechanism 203 described with respect to FIG. 2. The volume of three-dimensional ventilation port 200 may be defined by a base and walls as shown in FIG. 2 and may include open area 302. Open area 302 may be an area not covered by the perforated screen material and through which air may flow. By not being covered by the perforated screen material, open area 302 may allow access to the internal volume of three-dimensional ventilation port 200. However, due to the perforated screen material covering the walls and base of three-dimensional ventilation port 200, no objects larger than the perforations in the perforated screen material may enter the enclosure via the open area 302. The edges of the base and the walls of the three-dimensional ventilation port 200 surrounding open area 302 may house the electromagnetic interference gasket described in FIG. 2. Therefore, the edge of the walls and base surrounding open area 302 may be intended to seal a connection between three-dimensional ventilation port 200 and the front of an enclosure (e.g., front 104 of enclosure 102).

If lid 300 is placed on top of the enclosure (e.g., enclosure 102), three-dimensional ventilation port 200 may form a seal with first area 105 of front 104 and may not protrude from the front 104. Therefore, three-dimensional ventilation port 200 may reside entirely within the enclosure 102 when the lid is placed on the enclosure 102. If the lid is removed from enclosure 102, three-dimensional ventilation port 200 may detach from front 104 and be removed entirely from enclosure 102. Attaching three-dimensional ventilation port 200 to lid 300 may allow for hardware components 101 (and/or other components) to be added or removed from enclosure 102 without spatial interference from the three-dimensional ventilation port 200.

Figure 3B:
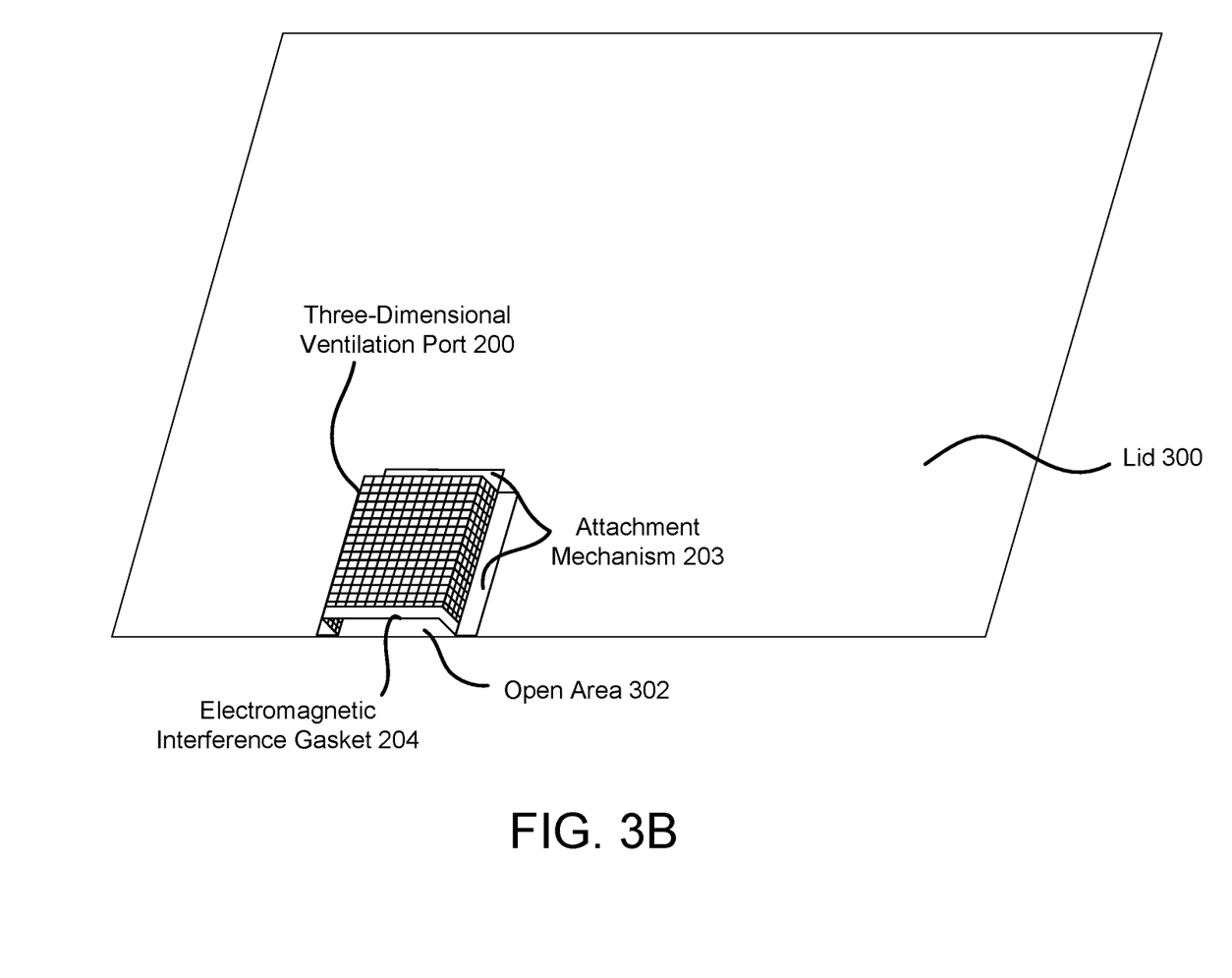
FIG. 3B shows a diagram illustrating a bottom view of a lid adapted to reversibly close a top of an enclosure in accordance with an embodiment.

Turning to FIG. 3B, a bottom view of a lid adapted to reversibly close a top of an enclosure is shown. As shown in FIG. 3A, three-dimensional ventilation port 200 may be attached to the lid 300 using attachment mechanism 203. Three-dimensional ventilation port 200 may include open area 302 as previously described in FIG. 3A. Open area 302 may be surrounded by edges of the base and the walls of the three-dimensional ventilation port 200 that house an electromagnetic interference gasket 204. As previously described in FIG. 2 with respect to electromagnetic interference gasket 204, electromagnetic interference gasket 204 may form a seal with the front of the enclosure (e.g., front 104 of enclosure 102) when the lid 300 is fitted to the enclosure 102.

Figure 3C:
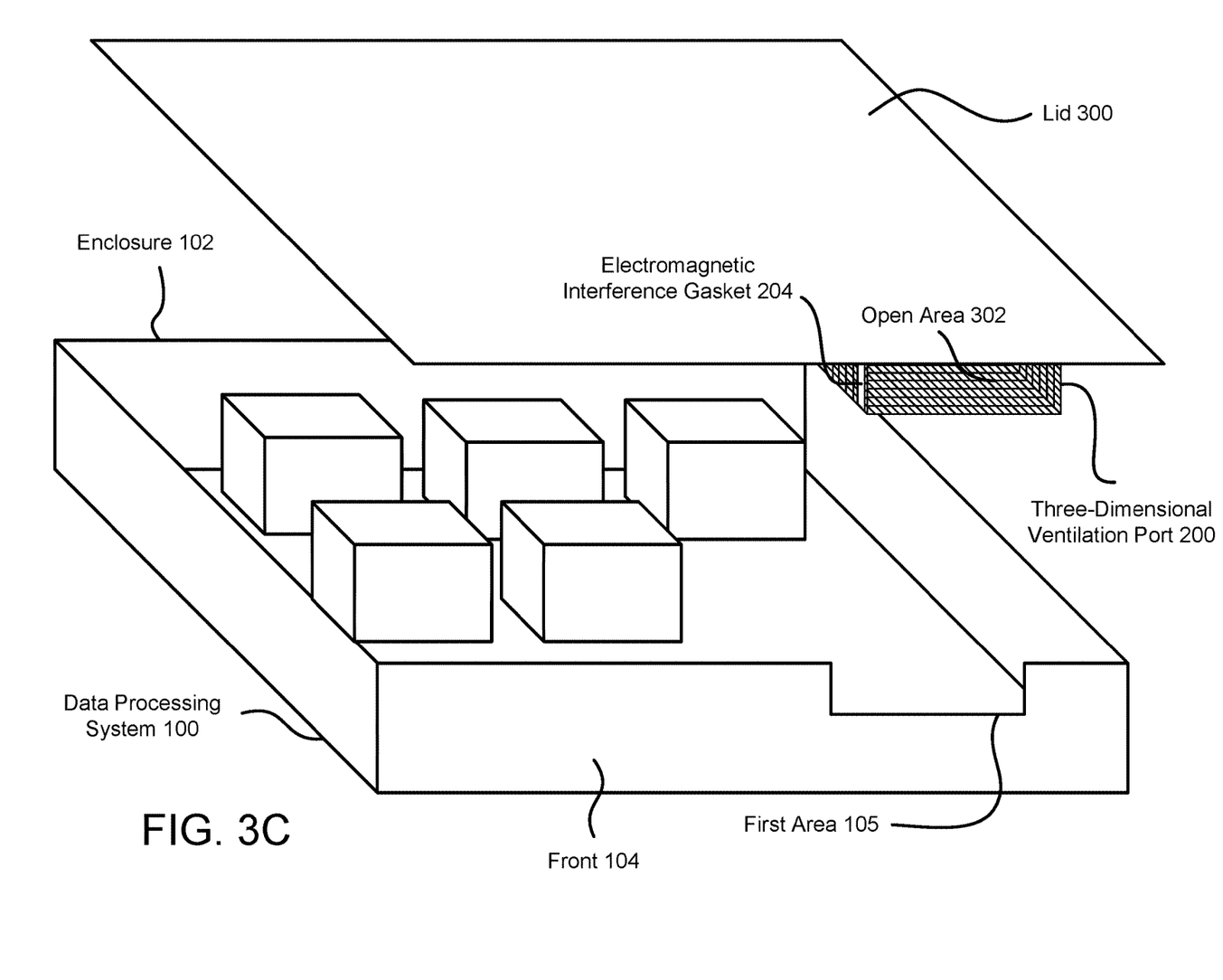
FIG. 3C shows a diagram illustrating a side view of a lid adapted to reversibly close a top of an enclosure in accordance with an embodiment.

Turning to FIG. 3C, a side view of a lid adapted to reversibly close a top of an enclosure lid 300 is shown. Lid 300 is shown above enclosure 102 in a configuration in which lid 300 may be placed on top of enclosure 102. As previously described, open area 302 of three-dimensional ventilation port 200 may match up with first area 105 of front 104 without protruding from front 104. The perforated screen material making up the walls and the base of three-dimensional ventilation port 200 may allow air to enter enclosure 102 through open area 302. The perforated screen material may also protect enclosure 102 from macroscopic objects entering the enclosure 102. As previously described, electromagnetic interference gasket 204 may seal the connection between three-dimensional ventilation port 200 and front 104 and may mitigate interference of electromagnetic fields in and around enclosure 102.

The three-dimensional ventilation port 200 may include a base and walls that define a rectangular volume as shown in FIG. 2. However, hardware components and/or other components internal to the data processing system (e.g., data processing system 100) may take up space proximate to the three-dimensional ventilation port inside enclosure 102 and, therefore, a rectangular volume may not be ideal for the configuration of components inside enclosure 102. The walls and base of three-dimensional ventilation port 200 may define a shape other than a rectangle to accommodate the internal components of enclosure 102 as described below.

Figure 4A:
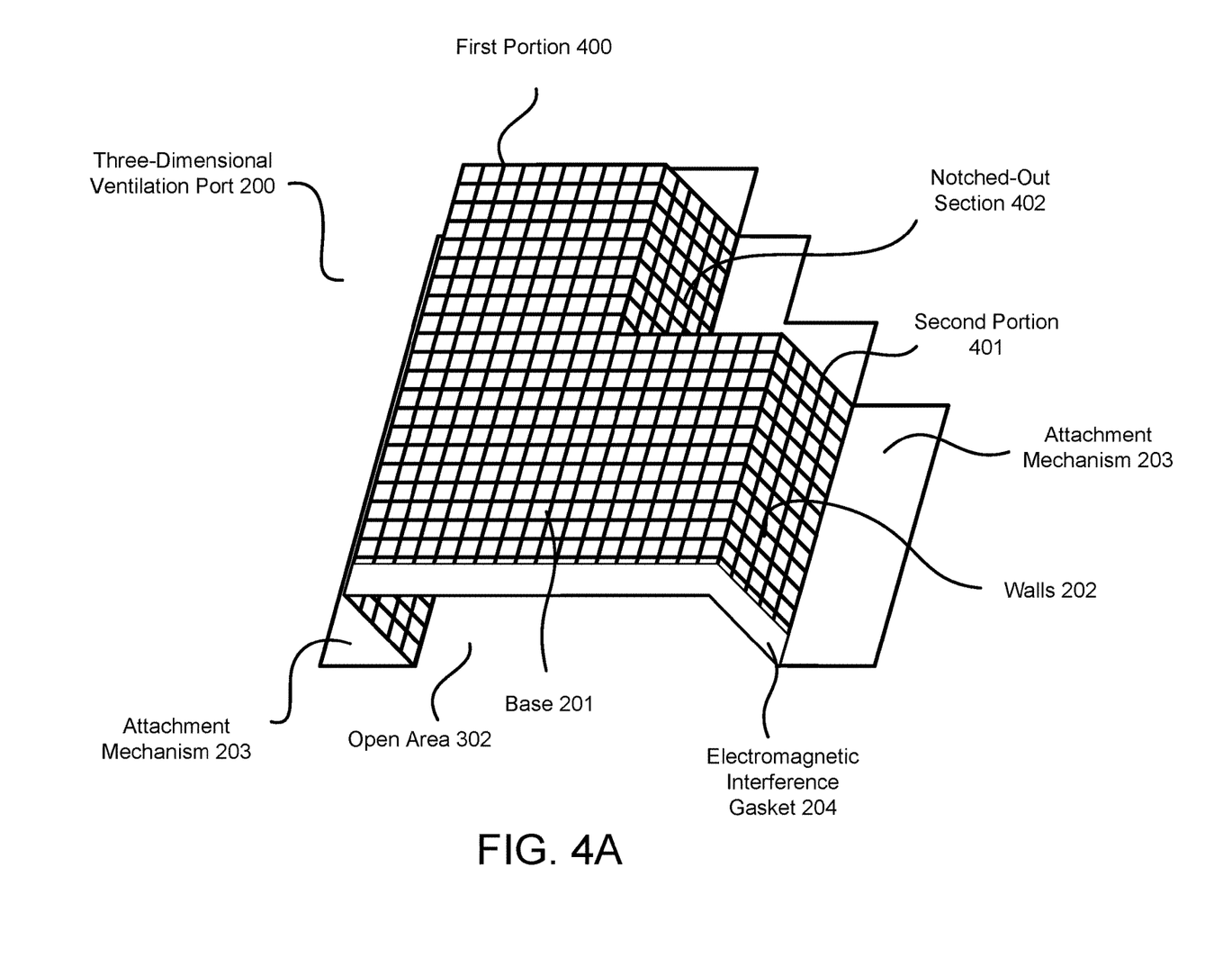
FIG. 4A shows a diagram illustrating a three-dimensional ventilation port with a notched-out section in accordance with an embodiment.

Turning to FIG. 4A, a diagram illustrating a three-dimensional ventilation port with a notched-out section is shown. The base 201 of three-dimensional ventilation port 200 may include a first portion 400 that extends a first distance from the open area 302 and a second portion 401 that extends a second distance from the open area 302. The first distance may be greater than the second distance. The first portion 400 and the second portion 401 may form notched-out section 402 of three-dimensional ventilation port 200. Notched-out section 402 may allow the three-dimensional ventilation port 200 to fit inside the enclosure 102 without making undesired contact with any of hardware components 101 and/or other components internal to data processing system 100.

Figure 4B:
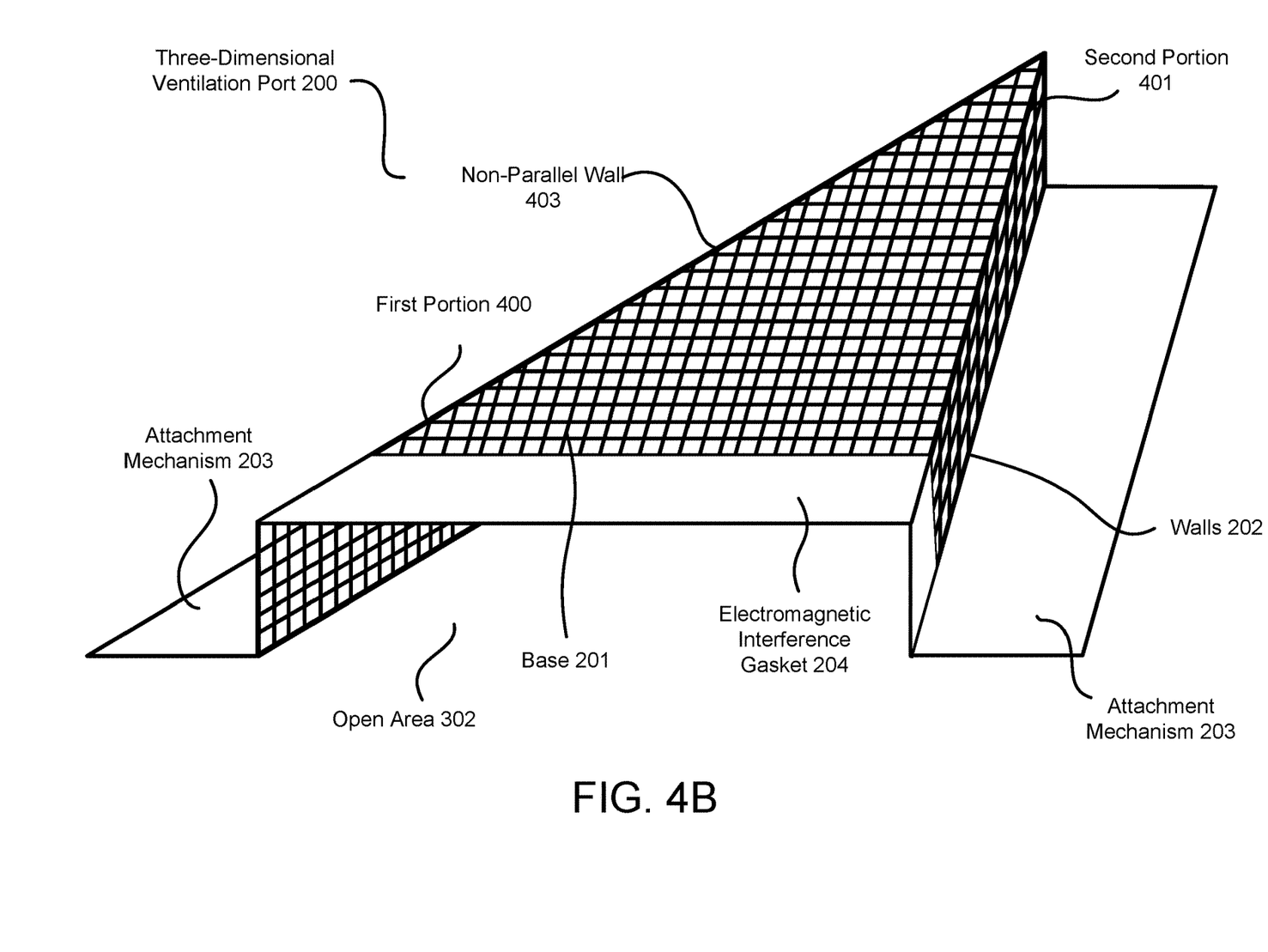
FIG. 4B shows a diagram illustrating a three-dimensional ventilation port with a non-parallel wall in accordance with an embodiment.

In addition to notched-out section 402, the three-dimensional ventilation port 200 may assume additional shapes to accommodate the internal components of data processing system 100. Turning to FIG. 4B, a diagram illustrating a three-dimensional ventilation port with a non-parallel wall is shown. The base 201 may assume a triangular shape and walls 202 may include a non-parallel wall 403. Non-parallel wall 403 may be located in a first plane, the open area 302 may be located in a second plane, and the first plane and the second plane may not be parallel to each other.

While illustrated in FIGS. 4A-4B with example shapes, it will be appreciated that a three dimensional-ventilation port in accordance with embodiments disclosed herein may have more complicated shapes (e.g., curved, multifaceted, etc.) without departing from embodiments disclosed herein.

The three-dimensional ventilation port may allow for increased rates of air flow through data processing system 100 and, therefore, more efficient cooling of hardware components 101. Turning to FIG. 5, a block diagram illustrating an air flow path through an enclosure (e.g., enclosure 102) of a data processing system is shown.

Data processing system 500 (similar to data processing system 100) may include temperature-sensitive hardware components 502. Temperature-sensitive hardware components 502 may be integral to the performance of the computer-implemented services provided by data processing system 500 and the temperature-sensitive hardware components 502 may be associated with certain thermal dissipation requirements. To meet the thermal dissipation requirements for temperature-sensitive hardware components 502, data processing system 500 may include components to monitor and regulate temperature throughout the data processing system 500. These components may include temperature sensors 504, fan 506, and three-dimensional ventilation port 508.

To determine whether the thermal dissipation requirements of the temperature-sensitive hardware components 502 are met, the temperature sensors 504 may collect temperature data at various locations within data processing system 500. Temperature sensors 504 may include any number and type of temperature sensors. If the temperature sensors 504 determine that the temperature proximate to the temperature-sensitive hardware components is outside a threshold for optimal thermal dissipation requirements, fan 506 may activate to initiate air flow throughout data processing system 500. Fan 506 may include any number of fans and may establish an air flow path from a first side of the data processing system 500 to a second side of data processing system 500. For example, fans 506 may draw cooler air through the front 510 as shown by intake airflow 512 and may exhaust warmer air though rear 514 as shown by exhaust airflow 516. While shown in FIG. 5 with example air flows, the air flows may follow different paths, may be in different directions (e.g., reversed), and/or may have different characteristics without departing from embodiments disclosed herein.

The thermal dissipation requirements of the temperature-sensitive hardware components 502 may specify an optimal rate of air flow to efficiently perform thermal exchange and cool the temperature-sensitive hardware components 502. Fans 506 may be incapable of generating this rate of air flow due to the constriction of the air flow through open area 518 on front 510. However, by implementing three-dimensional ventilation port 508 (made of a perforated screen material that allows air to flow though it in multiple directions), air may flow through a larger surface area covered in a mesh than open area 518 (e.g., air flow is shown in FIG. 5 by the dashed lines traveling through all sides of the three-dimensional ventilation port 508). Consequently, the effective open area of the surface of three-dimensional ventilation port 508 may present little impedance to the flow of air and facilitate removal of the screen from open area 518 thereby decreasing its impedance to air flow. The net result may be reduced impedance to flow of air through data processing system 500.

Thus, air flow may be less constricted through the front 510 and air flow rates may be increased within data processing system 500. Consequently, data processing system 500 may more efficiently meet thermal dissipation requirements of temperature-sensitive hardware components 502 required to perform the computer-implemented services.

Accordingly, embodiments disclosed herein may address, among others, the technical problem of thermal management of hardware components that may generate heat during operating. Embodiments disclosed herein may do so by reducing impedance to air flow without increase the quantity of surface area through which air may flow through a data processing system. Thus, a data processing system in accordance with embodiments may provide improved rates of cooling while conforming to computing environment standards that may limit the surface area through which gasses may be drawn into and exhausted out of data processing systems.

Figure 6:
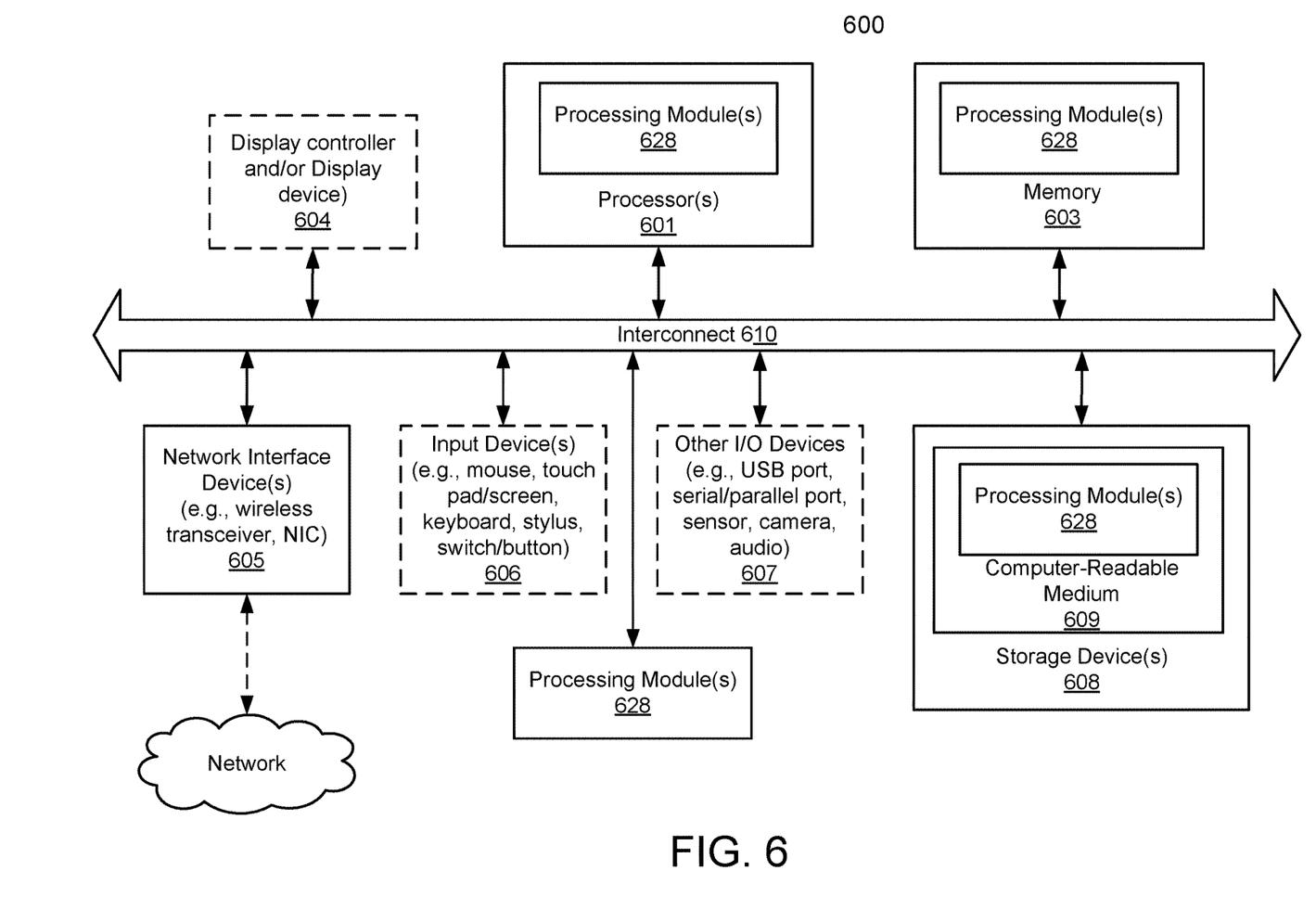
FIG. 6 shows a block diagram illustrating a computing device in accordance with an embodiment.

Any of the components illustrated in FIGS. 1-5 may be implemented with one or more computing devices. Turning to FIG. 6, a block diagram illustrating an example of a computing device in accordance with an embodiment is shown. For example, system 600 may represent any of the data processing systems and/or computing devices described above performing any of the processes or methods described above. System 600 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 600 is intended to show a high level view of many components of the computer system. However, it is to be understood that additional components may be present in certain implementations and furthermore, different arrangement of the components shown may occur in other implementations. System 600 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 600 includes processor 601, memory 603, and devices 605-608 via a bus or an interconnect 610. Processor 601 may represent a single processor or multiple processors with a single processor core or multiple processor cores included therein. Processor 601 may represent one or more general-purpose processors such as a microprocessor, a central processing unit (CPU), or the like. More particularly, processor 601 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 601 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 601, which may be a low power multi-core processor socket such as an ultra-low voltage processor, may act as a main processing unit and central hub for communication with the various components of the system. Such processor can be implemented as a system on chip (SoC). Processor 601 is configured to execute instructions for performing the operations discussed herein. System 600 may further include a graphics interface that communicates with optional graphics subsystem 604, which may include a display controller, a graphics processor, and/or a display device.

Processor 601 may communicate with memory 603, which in one embodiment can be implemented via multiple memory devices to provide for a given amount of system memory. Memory 603 may include one or more volatile storage (or memory) devices such as random access memory (RAM), dynamic RAM (DRAM), synchronous DRAM (SDRAM), static RAM (SRAM), or other types of storage devices. Memory 603 may store information including sequences of instructions that are executed by processor 601, or any other device. For example, executable code and/or data of a variety of operating systems, device drivers, firmware (e.g., input output basic system or BIOS), and/or applications can be loaded in memory 603 and executed by processor 601. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 600 may further include IO devices such as devices (e.g., 605, 606, 607, 608) including network interface device(s) 605, optional input device(s) 606, and other optional IO device(s) 607. Network interface device(s) 605 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 606 may include a mouse, a touch pad, a touch sensitive screen (which may be integrated with a display device of optional graphics subsystem 604), a pointer device such as a stylus, and/or a keyboard (e.g., physical keyboard or a virtual keyboard displayed as part of a touch sensitive screen). For example, input device(s) 606 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 607 may include an audio device. An audio device may include a speaker and/or a microphone to facilitate voice-enabled functions, such as voice recognition, voice replication, digital recording, and/or telephony functions. Other IO devices 607 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 607 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 610 via a sensor hub (not shown), while other devices such as a keyboard or thermal sensor may be controlled by an embedded controller (not shown), dependent upon the specific configuration or design of system 600.

To provide for persistent storage of information such as data, applications, one or more operating systems and so forth, a mass storage (not shown) may also couple to processor 601. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 601, e.g., via a serial peripheral interface (SPI). This flash device may provide for non-volatile storage of system software, including a basic input/output software (BIOS) as well as other firmware of the system.

Storage device 608 may include computer-readable storage medium 609 (also known as a machine-readable storage medium or a computer-readable medium) on which is stored one or more sets of instructions or software (e.g., processing module, unit, and/or processing module/unit/logic 628) embodying any one or more of the methodologies or functions described herein. Processing module/unit/logic 628 may represent any of the components described above. Processing module/unit/logic 628 may also reside, completely or at least partially, within memory 603 and/or within processor 601 during execution thereof by system 600, memory 603 and processor 601 also constituting machine-accessible storage media. Processing module/unit/logic 628 may further be transmitted or received over a network via network interface device(s) 605.

Computer-readable storage medium 609 may also be used to store some software functionalities described above persistently. While computer-readable storage medium 609 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies disclosed herein. The term "computer-readable storage medium" shall accordingly be taken to include, but not be limited to, solid-state memories, and optical and magnetic media, or any other non-transitory machine-readable medium.

Processing module/unit/logic 628, components and other features described herein can be implemented as discrete hardware components or integrated in the functionality of hardware components such as ASICS, FPGAs, DSPs or similar devices. In addition, processing module/unit/logic 628 can be implemented as firmware or functional circuitry within hardware devices. Further, processing module/unit/logic 628 can be implemented in any combination hardware devices and software components.

Note that while system 600 is illustrated with various components, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g., circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A data processing system for proving computer-implemented services, comprising:
    an enclosure comprising:
        a front and a rear that define an air flow path, the front of the enclosure comprises a front panel comprising:
            a first area that is provided with means for providing ventilation for the enclosure, and
            a second area that is adjacent to the first area on the front panel and that is provided without the means for providing ventilation for the enclosure; and
        a lid adapted to reversibly close a top of the enclosure, the lid being perpendicular to the front panel;
    a hardware component positioned along the air flow path, the hardware component having a thermal dissipation requirement that is met when a rate of an air flow along the air flow path is above a threshold;
    a fan positioned in an interior of the enclosure, the fan being adapted to generate the air flow along the air flow path by pulling air from outside the enclosure into the enclosure via the means for providing ventilation of the first area; and
    a three-dimensional ventilation port attached to the lid and positioned proximate to the first area of the front panel, the three-dimensional ventilation port being one of the means for providing ventilation and comprising a permeable screen that extends from edges of the first area into an interior of the enclosure, the permeable screen delimiting an area within the enclosure that that is larger than an area on the enclosure delimited by the first area, and removing the lid detaches the three-dimensional ventilation port from the enclosure.

2. The data processing system of claim 1, wherein the three-dimensional ventilation port comprises a base and walls that define a three-dimensional space, the base and the walls being made of a perforated screen material.

3. The data processing system of claim 2, wherein the perforated screen material making up the walls and the base of the three-dimensional ventilation port disburses the air, that is pulled in by the fan from outside the enclosure into the enclosure, into an area within the enclosure behind the second area.

4. The data processing system of claim 3, wherein the three-dimensional ventilation port comprises a mechanism positioned to attach the three-dimensional ventilation port to the enclosure.

5. The data processing system of claim 4, wherein the three-dimensional ventilation port comprises an electromagnetic interference gasket, the electromagnetic interference gasket being positioned to seal the three-dimensional ventilation port to at least a portion of the edges of the first area.

6. The data processing system of claim 5, wherein no parts of the three-dimensional ventilation port protrude out of the enclosure.

7. The data processing system of claim 5, wherein the hardware component is positioned proximate to the first area, the walls and base being arranged to enclose a volume that:
    extends from the first area into the enclosure, and comprises:
        a first portion that extends a first distance from the first area, and
        a second portion that extends a second distance from the first area, the first distance being larger than the second distance.

8. The data processing system of claim 7, wherein one of the walls that is on an opposite side of the volume from the first area is positioned in a first plane, the first area being in a second plane, and the first plane and the second plane not being parallel to each other.

9. A data processing system for proving computer-implemented services, comprising:
    an enclosure comprising:
        a front and a rear that define an air flow path, the front of the enclosure comprises a front panel comprising:
            first area that is provided with means for providing ventilation for the enclosure, and
            a second area that is adjacent to the first area on the front panel and that is provided without the means for providing ventilation for the enclosure; and
        a lid adapted to reversibly close a top of the enclosure, the lid being perpendicular to the front panel;
    a fan positioned in an interior of the enclosure, the fan being adapted to generate the air flow along the air flow path to cool a hardware component by pulling air from outside the enclosure into the enclosure via the means for providing ventilation of the first area, the hardware component having a thermal dissipation requirement that is met when a rate of an air flow along the air flow path is above a threshold; and
    a three-dimensional ventilation port attached to the lid and positioned proximate to the first area of the front panel, the three-dimensional ventilation port being one of the means for providing ventilation and comprising a permeable screen that extends from edges of the first area into an interior of the enclosure, the permeable screen delimiting an area within the enclosure that that is larger than an area on the enclosure delimited by the first area, and removing the lid detaches the three-dimensional ventilation port from the enclosure.

10. The data processing system of claim 9, wherein the three-dimensional ventilation port comprises a base and walls that define a three-dimensional space, the base and the walls being made of a perforated screen material.

11. The data processing system of claim 10, wherein the perforated screen material making up the walls and the base of the three-dimensional ventilation port disburses the air, that is pulled in by the fan from outside the enclosure into the enclosure, into an area within the enclosure behind the second area.

12. The data processing system of claim 11, wherein the three-dimensional ventilation port comprises a mechanism positioned to attach the three-dimensional ventilation port to the enclosure.

13. The data processing system of claim 12, wherein the three-dimensional ventilation port comprises an electromagnetic interference gasket, the electromagnetic interference gasket being positioned to seal the three-dimensional ventilation port to at least a portion of the edges of the first area.

14. The data processing system of claim 13, wherein no parts of the three-dimensional ventilation port protrude out of the enclosure.

15. The data processing system of claim 13, wherein the hardware component is positioned proximate to the first area, the walls and base being arranged to enclose a volume that:
 extends from the first area into the enclosure, and comprises:
  a first portion that extends a first distance from the first area, and
  a second portion that extends a second distance from the first area, the first distance being larger than the second distance.

16. The data processing system of claim 15, wherein one of the walls that is on an opposite side of the volume from the first area is positioned in a first plane, the first area being in a second plane, and the first plane and the second plane not being parallel to each other.

17. The data processing system of claim 1, wherein the three-dimensional ventilation port is adapted to increase the rate of the air flow within the enclosure beyond a rate that the fan is capable of generating alone without assistance from the three-dimensional ventilation port.

18. The data processing system of claim 17, wherein the air from outside the enclosure being pulled into the enclosure by the fan is constricted by a structure of the enclosure to entering the enclosure only from the means for providing ventilation that is provided only in the first area and not in the second area.

19. The data processing system of claim 1, wherein, when the lid is fully attached to the enclosure, a seal is formed between a surface of the three-dimensional ventilation port and a surface of the front panel that delimits the edges of the first area.

20. The data processing system of claim 1, wherein the three-dimensional ventilation port further comprises one or more attachment mechanisms for physical attachment to the lid of the enclosure, the one or more attachment mechanisms extending from the permeable screen of the three-dimensional ventilation port and being non-permeable.

* * * * *

UNITED STATES PATENT AND TRADEMARK OFFICE
CERTIFICATE OF CORRECTION

PATENT NO. : 12,317,446 B2
APPLICATION NO. : 18/048144
DATED : May 27, 2025
INVENTOR(S) : Eric Michael Tunks et al.

It is certified that error appears in the above-identified patent and that said Letters Patent is hereby corrected as shown below:

In the Claims

Claim 1, Column 13, Line 39, the word "proving" should instead be --providing--.

Claim 1, Column 13, Line 66, the phrase "an area within the enclosure that that" should instead read --an area within the enclosure that--.

Claim 3, Column 14, Line 9, the word "disburses" should instead be --disperses--.

Claim 9, Column 14, Line 41, the word "proving" should instead be --providing--.

Claim 9, Column 14, Line 67, the phrase "an area within the enclosure that that" should instead read --an area within the enclosure that--.

Claim 11, Column 15, Line 10, the word "disburses" should instead be --disperses--.

Signed and Sealed this
Twenty-second Day of July, 2025

Coke Morgan Stewart
*Acting Director of the United States Patent and Trademark Office*